(12) United States Patent
Torii

(10) Patent No.: US 6,432,825 B1
(45) Date of Patent: *Aug. 13, 2002

(54) SEMICONDUCTOR DEVICE PRODUCTION METHOD

(75) Inventor: Koji Torii, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/447,216

(22) Filed: Nov. 23, 1999

(30) Foreign Application Priority Data

Dec. 3, 1998 (JP) .......................................... 10-343885

(51) Int. Cl.$^7$ ............................................ H01L 21/302
(52) U.S. Cl. ..................................................... 438/692
(58) Field of Search ................................ 438/690, 691, 438/692, 693

(56) References Cited

U.S. PATENT DOCUMENTS

| | | | | |
|---|---|---|---|---|
| 4,879,258 A | | 11/1989 | Fisher ........................ 437/225 |
| 4,960,485 A | * | 10/1990 | Ichinose et al. ............ 156/556 |
| 5,196,353 A | * | 3/1993 | Sandhu et al. ................. 437/8 |
| 5,314,843 A | | 5/1994 | Yu et al. ..................... 437/225 |
| 5,514,245 A | | 5/1996 | Doan et al. ............... 156/636.1 |
| 5,730,642 A | * | 3/1998 | Sandhu et al. ................. 451/6 |
| 5,775,980 A | * | 7/1998 | Sasaki et al. ................ 451/285 |
| 5,837,557 A | * | 11/1998 | Fulford, Jr. et al. ............. 438/6 |
| 5,859,466 A | * | 1/1999 | Wada .......................... 257/508 |
| 5,934,980 A | * | 8/1999 | Koos et al. .................... 451/41 |
| 5,957,750 A | * | 9/1999 | Brunelli .......................... 451/7 |
| 6,020,262 A | * | 2/2000 | Wise et al. .................. 438/691 |
| 6,120,347 A | * | 9/2000 | Sandhu et al. .................. 451/5 |
| 6,150,271 A | * | 11/2000 | Easter et al. ................ 438/692 |

FOREIGN PATENT DOCUMENTS

| | | |
|---|---|---|
| JP | A 8-243915 | 9/1996 |
| JP | 9-326392 | 12/1997 |
| JP | A 10-189597 | 7/1998 |

OTHER PUBLICATIONS

Wolf, Silicon Processing for the VLSI Era, vol. 2—Process Integration, 1990, pp. 199–200.*

* cited by examiner

Primary Examiner—Benjamin L. Utech
Assistant Examiner—Matthew Anderson
(74) Attorney, Agent, or Firm—Young & Thompson

(57) ABSTRACT

To provide a semiconductor device production method capable of solving the problem of the latent period of time in which polishing is hardly performed immediately after a polishing start. In order to reduce the latent period of time caused immediately after a metal film polishing start, the polishing process is preceded by an oxide removal step for removing oxide from an object to be polished.

6 Claims, 3 Drawing Sheets

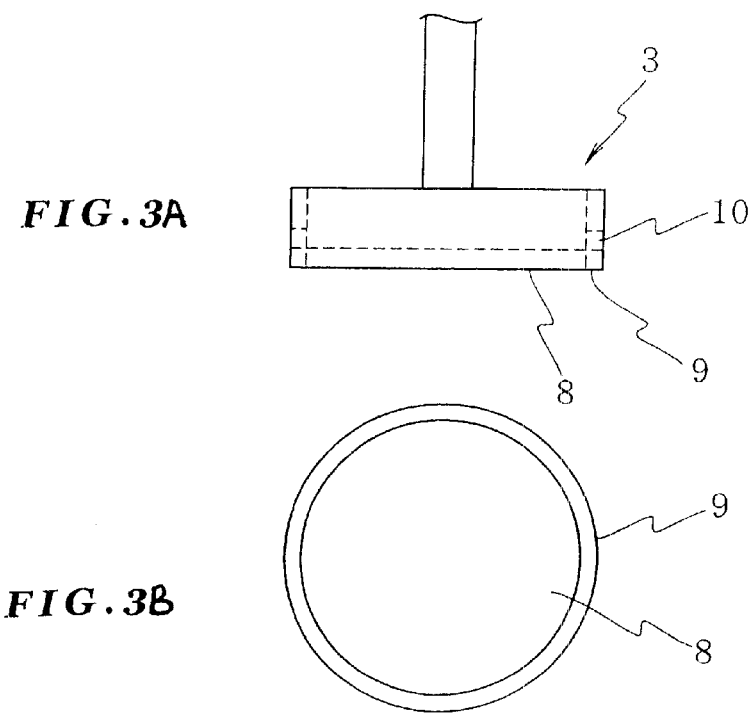
FIG. 3A
FIG. 3B
FIG. 4
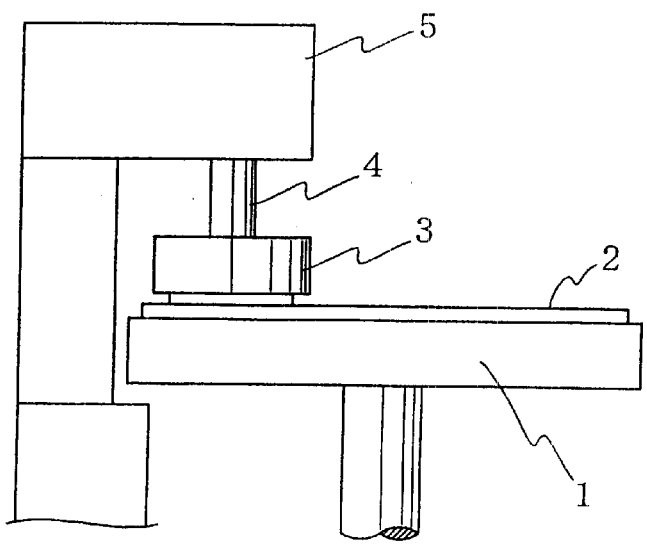

SEMICONDUCTOR DEVICE PRODUCTION METHOD

BACKGROUND OF THE INVENTION

1. Field of the Invention

The present invention relates to a semiconductor device production method and in particular, to a semiconductor device production method capable of reducing a latent period immediately after a polishing start when polishing a metal film formed on a semiconductor wafer.

2. Description of the Related Art

These years, with reduction in wiring pitch, it has become difficult to perform a direct patterning of a metal wiring by the dry etching method, and the damascene method has begun to be used for metal wiring formation. That is, a groove is formed in the insulation film and a metal film is buried in this groove by way of CVD (chemical vapor deposition), sputtering, plating and the like. Then, an unnecessary metal film on the insulation film is polished away by chemical-mechanical polishing method (hereinafter, referred to as CMP). Thus a metal film is buried in the groove. Here, the polishing rate of the insulation film is set lower than the polishing rate of the metal film. Thus, the insulation film serves as a stopper so as to suppress the polishing of the metal film in the groove. However, various problems are involved in this polishing of the metal film. This will be explained with the polishing apparatus configuration and polishing procedure.

FIG. 4 is a cross sectional view of a basic configuration of a conventional polishing apparatus. A polishing pad 2 is mounted on a rotary platen 1. Moreover, above the platen 1, a carrier 3 is arranged to hold and pressurize a semiconductor wafer. This carrier 3 is connected directly to a spindle 4 and is rotatable. Moreover, the spindle 4 is supported by a polishing arm 5 in such a manner that the spindle 4 can move up and down. A semiconductor wafer is mounted on the carrier 3 with its polishing surface facing the polishing pad 2. The platen 1 is rotated and the carrier 3 is lowered and pressurizes the semiconductor wafer. While abrasive is supplied to the polishing pad 2, the carrier 3 is rotated in the same direction as the platen 1. Thus, polishing is performed. Although not depicted, at the polishing pad side, there is provided a dressing mechanism for performing dressing during a polishing operation or between polishing operations. The abrasive normally contains oxidant and alumina particles or silica particles.

The metal film to be polished in the semiconductor device production procedure may be tungsten (W), aluminium (Al), copper (Cu) or the like. Moreover, considering the EM resistance and sufficient attachment of the wiring, the metal film has an undercoat made from Ti, TiN, TiW or the like.

FIG. 5 shows a polishing amount changing according to the time when polishing a wafer. Two curves are shown, corresponding two different positions on the wafer. This example is polishing behavior when polishing tungsten (W). As is clear from the figure, the polishing speed is very slow for 10 to 30 seconds immediately after the polishing start, and after this period, the polishing speed is abruptly increased. Thus, this polishing is characterized by a latent period $T_0$ when polishing hardly advances immediately after the polishing start.

Because of the aforementioned relationship between the polishing amount and time, the conventional semiconductor device production method has following problems.

Firstly, the aforementioned relationship between the polishing amount and time may deteriorate the uniformity on the wafer surface. As shown in FIG. 5, if the latent time differs within the wafer surface, the polishing amount also differs within the wafer surface. For example, in 50 seconds after polishing start, the polishing amount differs by as much as 150 nm. If the polishing amount differs extremely, then at the rapidly polished portion, the polishing advances more than necessary, causing configuration problems called dishing and erosion. Thus, it becomes impossible to satisfy the product specifications. Moreover, in the later step, sufficient flattening cannot be obtained, requiring a complicated additional step.

The second problem is that the polishing rate is not stable. If the latent time changes by several seconds, the polishing amount, for example, for 1 minute immediately after the polishing start is remarkably changed. The entire polishing time is as short as 1 or 2 minutes. Accordingly, the irregularities in the latent time $T_0$ affect much.

Moreover, Japanese Patent Publication A8-339982 [1] discloses a semiconductor device production method, in which infrared rays are used to detect an end of an appropriate polishing.

That is, in this invention of Citation [1], there is no technical concept of solving the problem of the latent period of time when polishing is hardly performed.

Furthermore, Japanese Patent Publication A9-55361 [2] discloses a semiconductor device production method in which a temperature regulator controls the temperature of the polishing surface via a semiconductor substrate, so as to control chemical polishing function of the slurry.

In the invention of Citation [2], temperature control is simply performed and there is no technical concept to suppress dishing using the oxide removal step and the flattening step.

Moreover, Japanese Patent Publication A8-339982 [3] discloses a semiconductor device production method, in order to effectively polish the insulation layer, $Mn_2O_3$ or $Mn_3O_4$ is used as an abrasive grain to be mixed with a solvent to constitute the abrasive.

Thus, this invention of citation [3] has no technical concept to solve the problem of the latent period of time when polishing is hardly performed.

SUMMARY OF THE INVENTION

The present invention has an object to provide a semiconductor device production method capable of improving the aforementioned conventional techniques so as to increase the uniformity on the surface and obtain stable polishing.

In order to attain the aforementioned object, the present invention employs the following basic techniques. That is, a first embodiment of the present invention provides a semiconductor device production method in which the metal film polishing includes an oxide removal step for removing oxide from the surface to be polished, so as to reduce the latent time immediately after polishing start when the polishing speed is extremely low. A second embodiment provides a semiconductor device production method in which the polishing step is preceded by a flattening step to flatten irregularities of the surface of the object to be polished, i.e., the metal film.

BRIEF DESCRIPTION OF THE DRAWINGS

FIG. 3(A) is a side view and FIG. 3(B) is a bottom view of a carrier used in the semiconductor device production method according to the present invention.

FIG. 4 is a cross sectional view of a basic configuration of a conventional polishing apparatus.

DESCRIPTION OF THE PREFERRED EMBODIMENTS

In order to solve the aforementioned problems in the conventional techniques, the semiconductor device production method according to a first embodiment of the present invention includes an oxide removal step for removing oxide from a surface of the object to be polished, i.e., a metal film, so as to reduce the latent time immediately after the polishing start in which the polishing speed is extremely slow. Moreover, in another embodiment of the present invention, in order to reduce the latent time immediately after the polishing start in which the polishing speed is extremely slow, the polishing step is preceded by a surface flattening step for flattening a surface of the object to be polished. This enables to obtain a stable polishing amount.

EXAMPLES

Figure 1:
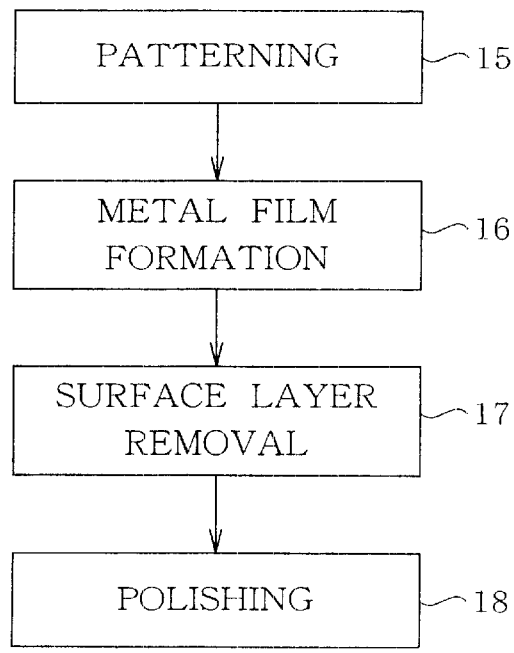
FIG. 1 shows a production procedure of the semiconductor device production method according to a first embodiment of the present invention.

Hereinafter, explanation will be given on a specific configuration of the semiconductor device production method according to the present invention with reference to the attached drawings. FIG. 1 shows a semiconductor device production procedure as a first example (Example 1) of the present invention. Firstly, patterning 15 is performed to form a pattern on a semiconductor wafer. Next, metal film generation step 16 generates a metal film. Here, in Example 1, as a surface layer removal step 17, a special polishing is performed. More specifically, the polishing step is divided into at least two steps. The first polishing step uses an alkali or neutral slurry and the second polishing step uses an acid slurry. A wafer surface is coated, for example, by a tungsten film of 400 to 800 nm thickness formed by the CVD method. The slurry used for the first polishing step may be, for example, prepared to have pH 10 to 12 using ammonia and contain 10% of silica as an abrasive grain. The pH can also be used in the neutral region. The polishing condition may be as follows: pressure applied to the wafer is 500 g/cm$^2$, the platen rotates at 25 rpm and the carrier rotates also at 25 rpm. The polishing time may be 10 to 20 seconds. It should be noted that the polishing pad may be a foam polyurethane. If the surface roughness is large and the oxide in concave cannot be removed effectively, the hardness of the polishing pad can be lowered to follow the convex and concave on the surface. This first polishing exposes a bulk W but the W polishing will not advance so much.

The slurry used for the second polishing step contains an oxidant such as hydrogen peroxide to obtain pH to 2 to 4 m and contains about 5% of silica as abrasive grain. The polishing condition may be, for example, as follows: pressure applied to the wafer is 300 g/cm2, platen rotation is 100 rpm, and carrier rotation is also 100 rpm. The polishing time should be such that an unnecessary portion of the tungsten W is sufficiently removed, i.e., about 1 to 3 minutes. The polishing pad may be foam polyurethane.

It should be noted that the basic configuration of the polishing apparatus used in this example is identical to that of the conventional method shown in FIG. 4. The apparatus includes a platen 1 which can be rotated by a motor or the like. A polishing pad 2 mounted on the upper surface of the platen 1. The apparatus further includes a carrier 3 above the platen 1 for holding and pressurizing a semiconductor wafer. This carrier 3 is connected to a spindle 4. The spindle 4 is connected to a motor or the like and can be rotated. These units are connected to a polishing arm 5 and can rotate and apply a weight. Moreover, through not depicted, the apparatus includes a dressing mechanism which can be rotated by a drive arm.

According to the semiconductor device production method including the aforementioned steps, as a surface portion removal step, a special polishing is performed in at least two steps. The first polishing step uses alkali or neutral slurry, and the second polishing step uses acid slurry. Because the surface layer is thus removed in this example, a uniform surface can be obtained. That is, after the oxide is removed from the surface, the polishing reaction starts immediately after the polishing start and there is no conventional problem of latent time. As a result, it becomes possible to suppress deterioration of uniform surface due to irregularities caused by the latent time difference throughout the surface. As the last step, polishing step 18 performs finish polishing.

Moreover, in another example (Example 2), polishing is performed at least in two steps. The first polishing step employs abrasive containing no oxidant, and the second polishing step employs abrasive containing oxidant. Because in the first polishing step, the abrasive does not contain oxidant and accordingly, even if oxide is removed, bulk tungsten will not be polished away. Consequently, if sufficient polishing is performed without oxidant, it is possible to obtain the surface from which oxide is removed. Since no oxidant is contained, the tungsten bulk is exposed and maintained as such. Next, polishing is performed by supplying abrasive containing oxidant. The polishing condition is identical as in Example 1.

In this example, although a latent period of time $T_0$ is caused, but it is possible to obtain a uniformity and stability. Moreover, it is possible to simplify the abrasive type.

In still another example (Example 3), the wet etching method is used to process the surface before polishing the tungsten (W). Here, tungsten oxide can be solved in an alkali solution, it is immersed in an alkali aqueous solution such as an aqueous solution of sodium hydroxide or potassium hydroxide for about 10 minutes. After that, polishing is performed. Since tungsten bulk crystal is exposed, it is possible to promote reaction between the tungsten and the oxidant.

In yet another example (Example 4) of the present invention, sputter etching is used to remove oxide from a surface before performing the tungsten (W) polishing. The putter etching is performed, for example, under the conditions of Ar flow rate 200 scc, RF output 400 W, and pressure 0.15 Pa for 30 seconds.

Figure 2:
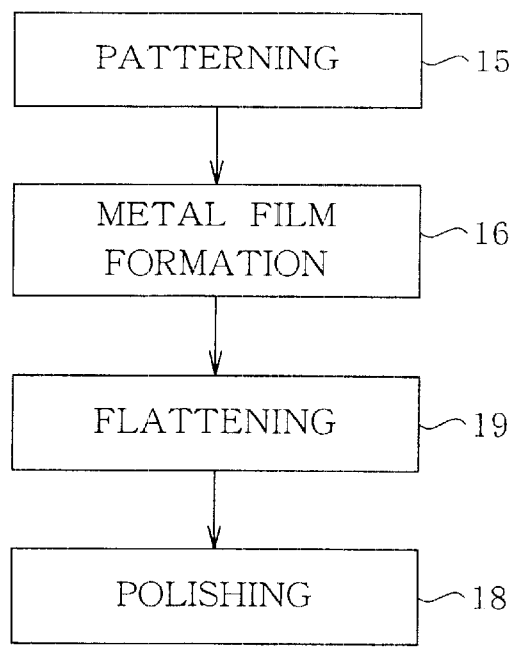
FIG. 2 shows a production procedure of the semiconductor device production method according to a second embodiment of the present invention.
Figure 5:
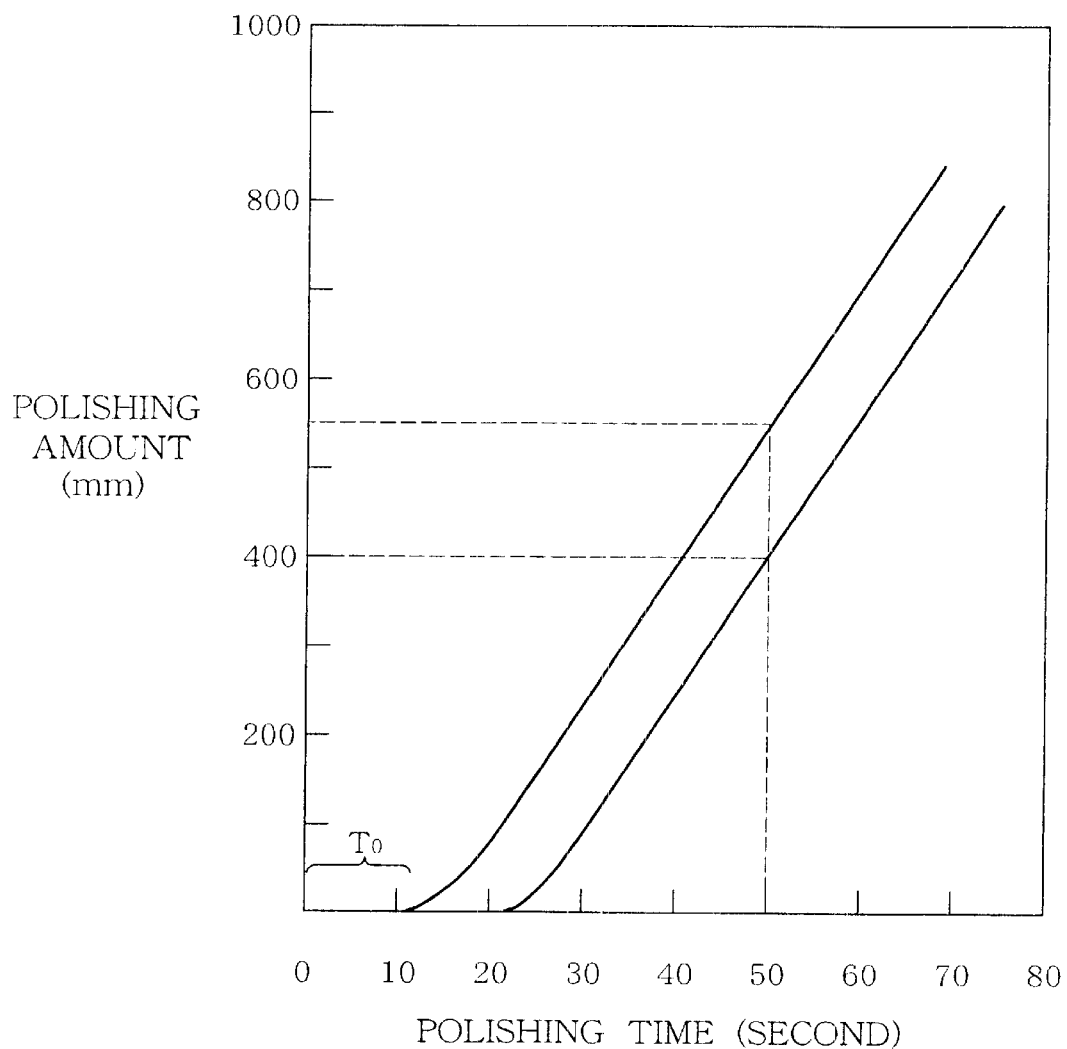
FIG. 5 is a graph showing the polishing amount change along the time axis in polishing one wafer.

Yet still another example (Example 5) of the semiconductor device production method includes a flattening step for flatten the semiconductor surface. FIG. 2 shows the semiconductor device production procedure according to a second embodiment. Here, explanation on the same steps as the first embodiment will be omitted. In the second embodiment, the flattening step 19 employs sputter etching for etching the metal film on the surface to flatten the surface, for example, tungsten surface. In this example, the temperature starts to increase immediately after the polishing start, which enables to reduce the latent period of time. The sputter etching condition may be, for example, Ar flow rate 200 sccm, RF output 800 W, pressure 0.15 Pa, and 120 seconds.

Still yet another example (Example 6) is characterized in that the polishing consists of at least two steps. The first polishing step requires a polishing condition or abrasive that a difference between the polishing rate of tungsten and that of oxide is small. The second polishing step is identical to the conventional method.

More specifically, the first polishing step employ abrasive containing about 10% of colloidal silica and having pH 2 to 4 adjusted by hydrogen peroxide or the like. The polishing condition is, for example, as follows: weight 300 g/cm$^2$, the platen and carrier rotation at 100 rpm. The polishing time is set to 10 to 60 seconds. In this case, a difference between the polishing rate of tungsten and that of oxide is small, and polishing rate can be seen immediately after the polishing start.

Yet another example (Example 7) of the present invention includes a temperature adjustment step for heating at the initial stage of the polishing. That is, immediately after the polishing start, the polishing pad surface is heated for 10 to 30 seconds while polishing is in progress. The heating means may be, for example, abrasive heated to 40 degrees C is applied at the initial stage. Alternatively, a lamp is arranged above the polishing pad to radiate immediately after the polishing start to heat the polishing pad surface. Moreover, as another means, it is also possible to provide a built-in heater 10 in the polishing table.

In still another example (Example 8) of the present invention, the surface removal step 17 includes at least two polishing steps. The first polishing step is performed with a high weight, and the second polishing step is performed with a lower weight.

The polishing condition may be, for example, as follows. The first polishing step is set to pressure 500 g/cm$^2$, polishing table rotation at 100 rpm, abrasive flow rate 200 cc/min, and polishing time 20 sec. The second polishing step is set to pressure 300 g/cm2, polishing table rotation at 100 rpm, abrasive flow rate 200 cc/min, and the polishing time is arbitrary.

In yet another example (Example 9), the surface removal step 17 for removing oxide includes at least two steps. The first step is performed with a wafer guide ring pressed with a high pressure and the second step is performed with the wafer guide ring pressed with a lower pressure. FIG. 3(a) is a side view and FIG. 3(b) is a bottom view of the carrier portion. The carrier 3 has a guide ring 9 to hold the semiconductor wafer 8 during polishing. If this guide ring 9 is brought into contact with the polishing pad during polishing operation, the pad surface temperature tends to increase. The pressure and the contact area of this guide ring has a proportional relationship with the heat. Utilizing this tendency, it is possible to accelerate the rise of the polishing pad surface temperature at an initial stage of polishing.

The polishing condition may be, for example, as follows. The first step is set to: guide ring pressure 500 g/cm$^2$; wafer pressure 300 g/cm$^2$; polishing table rotation at 100 rpm; abrasive flow rate 200 cc/min; and the polishing time 20 seconds. The second step is set to: guide ring pressure 300 g/cm$^2$; wafer pressure 300 g/cm$^2$; polishing table rotation 100 rpm; abrasive flow rate 200 cc/min; and the polishing time is arbitrary. It should be noted that the guide ring outer and inner diameters are assumed to be 10 to 30 mm.

Figure 6:
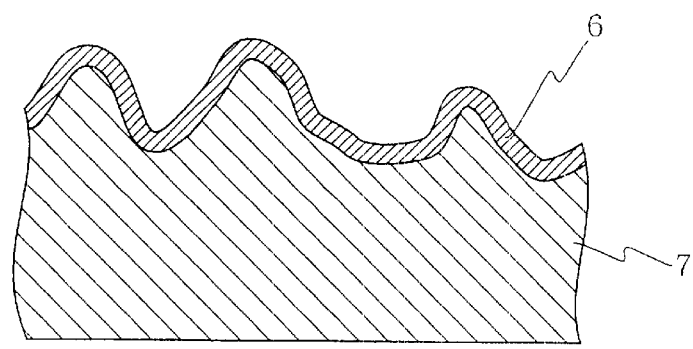
FIG. 6 is an enlarged cross section view of a tungsten film surface before polishing.

As has been described above, the preset invention provides a production method to eliminate the latent time immediately after a polishing start. FIG. 6 shows a tungsten film surface state before being polished. The latent time is caused by presence of oxide 6 on the metal film surface, which shows a strong passivation, suppressing a chemical reaction at the initial stage of polishing. Also, the latent time is caused by the convex and concave on the metal film surface, which results in a small contact area, causing little friction heat, i.e., the polishing pad surface temperature cannot increase rapidly, thus indirectly suppressing the chemical reaction.

It should be noted that the present invention is not to be limited to the aforementioned Examples, and various modifications can be performed within the scope of the present invention.

In order to reduce the latent period of time at which the polishing speed is extremely low, the present invention includes an oxide removal step before the polishing step for polishing a metal film. Thus, the present invention enables to reduce the latent period of time $T_0$ immediately after a polishing start, which in turn brings about a uniform surface and improves the polishing stability. This enables to obtain a metal film of uniform thickness after metal CMP, and to improve flatness. This results in increase of yield.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. A10-343885 (Filed on Dec. 3$^{rd}$, 1998) including specification, claims, drawings and summary are incorporated herein by reference in its entirety.

What is claimed is:

1. A semiconductor device production method comprising the steps of:

forming a metal film on a semiconductor wafer;

polishing the metal film while heating a polishing pad in a first polishing step; and polishing the metal film using the polishing pad in a second polishing step, the second polishing step being after said heating is stopped and a continuation of the first polishing step.

2. The semiconductor device production method of claim 1, wherein said heating is performed by applying a heated abrasive.

3. The semiconductor device production method of claim 1, wherein said heating is performed by arranging a radiation lamp above the polishing pad.

4. The semiconductor device production method of claim 1, wherein said heating is performed by using a built-in heater provided in a polishing table.

5. The semiconductor device production method of claim 1, wherein said first polishing step is performed with a first polishing pressure and said second polishing step is performed with a second polishing pressure that is lower than the first polishing pressure.

6. The semiconductor device production method of claim 1, wherein the semiconductor is held in a wafer guide ring and said first polishing step is performed with the wafer guide ring being pressed with a high pressure and said second polishing step is performed with the wafer guide ring being pressed with a lower pressure.

* * * * *